US010466551B2

(12) United States Patent
Song

(10) Patent No.: US 10,466,551 B2
(45) Date of Patent: Nov. 5, 2019

(54) WAVELENGTH-TUNABLE TYPE ETALON COMPRISING LCD-LAYER AND PREPARATION METHOD THEREOF

(71) Applicant: RESEARCH & BUSINESS FOUNDATION SUNGKYUNKWAN UNIVERSITY, Suwon-si (KR)

(72) Inventor: Jang Kun Song, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 15/647,384

(22) Filed: Jul. 12, 2017

(65) Prior Publication Data

US 2018/0017824 A1    Jan. 18, 2018

(30) Foreign Application Priority Data

Jul. 13, 2016    (KR) .................. 10-2016-0088713

(51) Int. Cl.
*G02F 1/13*        (2006.01)
*G02F 1/1347*    (2006.01)
(Continued)

(52) U.S. Cl.
CPC ....... *G02F 1/13473* (2013.01); *G02B 26/001* (2013.01); *G02F 1/216* (2013.01);
(Continued)

(58) Field of Classification Search
CPC . G02F 1/01; G02F 1/0107; G02F 1/03; G02F 1/07; G02F 1/13; G02F 1/13473; G02F 1/1337; G02F 1/1339; G02F 1/1341; G02F 1/13439; G02F 1/133553; G02F 1/135; G02F 1/133555; G02F 1/1354; G02F 1/13306; G02F 1/19; G02F 1/216; G02F 2001/1352; H01S 3/10; H01S 3/105;
(Continued)

(56) References Cited

U.S. PATENT DOCUMENTS 5,111,321 A * 5/1992 Patel .................. G02F 1/216
                                                     349/128
5,321,539 A * 6/1994 Hirabayashi ........... G02F 1/216
                                                     349/1
(Continued)

FOREIGN PATENT DOCUMENTS

JP    2001-21880 A    1/2001
JP    2010-175785 A    8/2010

OTHER PUBLICATIONS

Korean Office Action dated Aug. 10, 2017 in corresponding Korean Application No. 10-2016-0088713 (8 pages in Korean).

*Primary Examiner* — Wen Huang
(74) *Attorney, Agent, or Firm* — NSIP Law

(57) ABSTRACT

The present invention relates to a wavelength-tunable type etalon comprising a liquid crystal layer, which comprises: a first substrate; a second substrate; a reflective coating film; a transparent electrode; an alignment layer, which is independently formed while covering the opposing surface of the transparent electrode; a liquid crystal layer, which is disposed in a space between each of the alignment layer s; and a sealing member, which is provided for sealing of the liquid crystal layer; and a method for manufacturing the same.

18 Claims, 16 Drawing Sheets

(51) Int. Cl.
*G02F 1/21* (2006.01)
*G02B 26/00* (2006.01)
*H01S 5/14* (2006.01)
*G02B 6/293* (2006.01)
*H01S 3/106* (2006.01)

(52) U.S. Cl.
CPC .......... H01S 5/141 (2013.01); *G02B 6/29358* (2013.01); *G02B 6/29395* (2013.01); *H01S 3/1062* (2013.01); *H01S 3/1065* (2013.01)

(58) Field of Classification Search
CPC ........ H01S 3/1062; H01S 3/1065; H01S 5/14; H01S 5/141; G02B 26/001; G02B 6/29358; G02B 6/29395; G02B 5/28
USPC ...... 359/245–247, 253, 260; 438/29, 30, 57; 349/2, 16, 44, 111, 113, 122, 123, 132, 349/137, 138, 151, 153, 155, 198, 201; 372/20; 430/313
See application file for complete search history.

(56) References Cited

U.S. PATENT DOCUMENTS

| | | | |
|---|---|---|---|
| 5,381,253 A * | 1/1995 | Sharp | G02F 1/13471 349/116 |
| 5,592,314 A * | 1/1997 | Ogasawara | G02F 1/13473 349/114 |
| 5,640,260 A * | 6/1997 | Sumida | G02F 1/1354 349/26 |
| 5,710,655 A * | 1/1998 | Rumbaugh | G02F 1/21 359/249 |
| 5,973,817 A * | 10/1999 | Robinson | G02F 1/292 359/247 |
| 6,545,739 B1 * | 4/2003 | Matsumoto | G02B 6/29358 349/198 |
| 7,274,419 B2 * | 9/2007 | Tashiro | G02F 1/133553 349/113 |
| 9,397,477 B2 * | 7/2016 | Fu | H01S 3/1065 |

* cited by examiner

FIG. 4
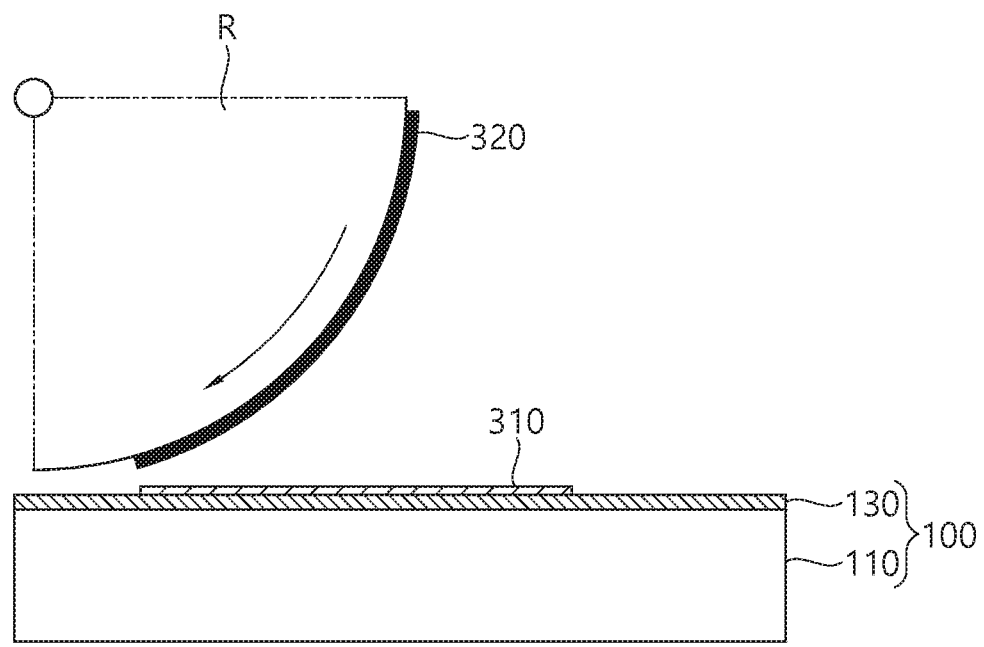
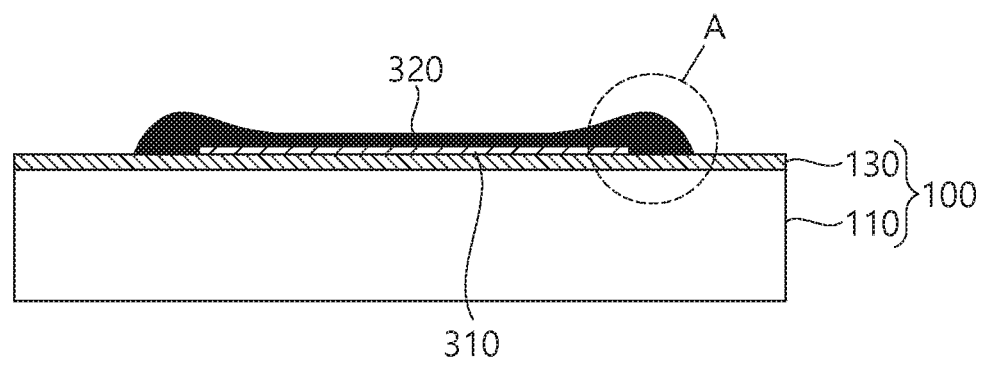

WAVELENGTH-TUNABLE TYPE ETALON COMPRISING LCD-LAYER AND PREPARATION METHOD THEREOF

CROSS-REFERENCE TO RELATED APPLICATION

This application claims priority to Korean Patent Application No. 10-2016-0088713 filed on Jul. 13, 2016, the contents of which are herein incorporated by reference in its entirety.

BACKGROUND OF THE INVENTION

Field of the Invention

The present invention relates to a wavelength-tunable type etalon comprising a liquid crystal layer and a method for manufacturing the same and, more specifically, to an etalon which is constituted in such a manner that the wavelength of the electromagnetic wave being transmitted by adjusting the liquid crystal layer inside of the etalon, and a method for manufacturing the same.

Related Art

An etalon is an optical element device, which allows only the light at particular wavelengths to be transmitted via interference by multi-reflection in two parallel mirror planes when two substrates containing a reflector are installed in proximity. The etalon is an optical device widely used in optical communication and it is a device having the advantages of high efficiency and wavelength selectivity. In particular, the etalon can be used in wavelength-tunable semiconductor laser containing an external cavity.

However, the conventional etalon had disadvantages in that it can select only the wavelengths at a fixed area but could not actively control wavelength.

SUMMARY OF THE INVENTION

An object of the present invention is to provide an etalon containing a liquid crystal layer for solving the problem that a selected wavelength cannot be controlled in a conventional etalon, and a method for manufacturing the same.

In order to solve the problems, the present invention provides an wavelength-tunable type etalon containing a liquid crystal layer, which includes: a first substrate, which is provided with a first inner surface and a first outer surface; a second substrate, which is disposed with a predetermined space from and in parallel with the first substrate and is provided with a second inner surface and a second outer surface; a reflective coating film, which is independently provided at the first inner surface side and the second inner surface side and opposes with each other; a transparent electrode, which is independently provided at one side of the reflective coating film; an alignment layer, which is independently formed while covering the opposing surface of the transparent electrode; a liquid crystal layer, which is disposed in a space between each of the alignment layer s; and a sealing member, which is provided for sealing of the liquid crystal layer.

The first and second substrates use a substrate material which has a characteristic of substantial transparency in the band of 1300 nm to 1700 nm, and glass, quartz, silicon, etc., may be used.

In particular, the alignment layer may be comprised by containing an inorganic insulating film, and the inorganic insulating film may be comprised by containing $SiO_x$ or $SiN_x$, and may be formed to have a thickness in the range of 30 nm to 200 nm.

Meanwhile, the sealing member may be provided along the periphery of the liquid crystal layer between the first and second substrates, and sealed by being in contact with the alignment layer.

Additionally, the sealing member may be provided along the periphery of the liquid crystal layer between the first and second substrates, and sealed by being in contact with the reflective coating film.

Meanwhile, the inorganic insulating film may be coated by vacuum deposition method.

Furthermore, the inorganic insulating film may be coated using a shadow mask so that the inorganic insulating film can be formed only on a part of the opposing surface of the reflective coating film while covering the transparent electrode.

Additionally, there may be provided a method for preparing an wavelength-tunable type etalon containing a liquid crystal layer, which includes: forming a first transparent electrode on a first substrate which includes a first reflective coating film; forming a first alignment layer so as to cover the first transparent electrode; forming a second transparent electrode on a second substrate containing a second reflective coating film; forming a second alignment layer so as to cover the second transparent electrode; coating a liquid crystal layer at a side of the first alignment layer; coating a sealing member so as to seal along the periphery of the liquid crystal layer; and disposing the first and second alignment layer s to oppose with each other and bonding the first and second substrates.

In particular, the first and second alignment layer s may be comprised of an inorganic insulating film.

Additionally, the forming of the first and second alignment layer s may be performed by a vacuum deposition method.

Meanwhile, the inorganic insulating film may contain $SiO_x$ or $SiN_x$.

In particular, the forming of the forming of the first alignment layer and forming of the second alignment layer may be performed to have a thickness in the range of 30 nm to 200 nm.

Additionally, the forming of the first alignment layer and the forming of the second alignment layer may be performed so that an inorganic insulating film can be formed on parts of the first and second substrates so as to prevent deposition in an area of a connecting portion, on which the first transparent electrode or the second transparent electrode can be connected to an external circuit, and an area in which the sealing member can be coated.

Additionally, the coating of the sealing member may be performed by placing the sealing member to be in contact with the first alignment layer.

Additionally, there may be provided a method for preparing wavelength-tunable type etalon containing a liquid crystal layer, which includes: forming a first transparent electrode on a first substrate which includes a first reflective coating film; forming a first alignment layer so as to cover the first transparent electrode; forming a second transparent electrode on a second substrate containing a second reflective coating film; forming a second alignment layer so as to cover the second transparent electrode; coating a sealing member on any one of the first substrate or the second substrate so as to form a space for receiving a liquid crystal layer; disposing the first and second alignment layer s to oppose with each other and bonding the first and second substrates; injecting a liquid crystal to the space for receiving a liquid crystal layer; and sealing the space for receiving a liquid crystal layer.

In particular, there may be additionally provided a method of cutting, in which the first alignment layer, the first transparent electrode, the second alignment layer, the second transparent electrode, and the sealing member are formed in a repeated pattern on multiple cells; and the multiple cells are separated by cutting the first and second substrates.

Furthermore, the cutting may include a first cutting, by which the injection hole of part of a liquid crystal layer of the multiple cells is exposed after the bonding; and a second cutting, by which each of the multiple cells is independently separated after the sealing of the space for receiving a liquid crystal layer.

BRIEF DESCRIPTION OF THE DRAWINGS

The above and other objects and features of the present invention will become apparent from the following description of preferred embodiments given in conjunction with the accompanying drawings, in which:

FIG. 4 shows a conceptual diagram illustrating a printing process of a culture membrane applied in the manufacture of LCD;

DETAILED DESCRIPTION OF THE EMBODIMENTS

Figure 1:
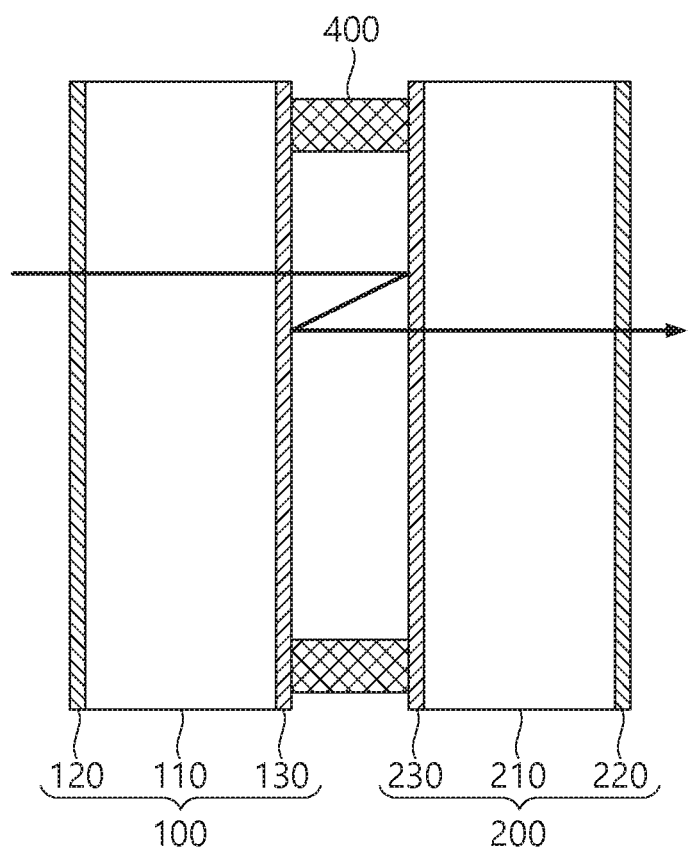
FIG. 1 shows a cross-sectional view of an existing etalon cell.

Hereinafter, an etalon containing a liquid crystal layer according to an embodiment of the present invention and a method of manufacturing the same will be described in detail with reference to the accompanying drawings.

And in the following description of the embodiments, the names of the respective components may be referred to as other names in the art. However, if there is a functional similarity and an equivalence thereof, the adoption of a modified embodiment may also be regarded as an equivalent constitution. Additionally, reference numerals added to respective components are described for convenience of explanation. However, the contents illustrated in the drawings in which the reference numerals are described do not limit respective components to the scope within the drawings. Likewise, even if an embodiment in which parts of the configurations on the drawings are modified is adopted, it may be regarded as an equivalent configuration as long as there are functional similarities and identities. Additionally, in light of the level of one of ordinary skill in the art, if it is recognized as a component to be included, a description relating thereto will be omitted.

FIG. 1 is a cross-sectional view of an existing etalon cell. As shown, an etalon includes a first substrate 100, a second substrate 200, and a spacer 400.

The first substrate 100 may be comprised of a first low reflective coating film (antireflection coating film) 120, a first glass substrate 110, and a first reflective coating film (high reflection coating) 130.

The first antireflection coating film 120 may be provided on a first outer surface toward the outer direction of the first glass substrate 110, and the first reflective coating film 130 may be provided on a first inner surface, which is the inner surface of the first glass substrate 110. In particular, the first glass substrate 110 refers to a plate including a colorless transparent material such as glass or quartz. Generally, the first reflective coating film 130 may be a dielectric mirror made by stacking dielectric layers, and the reflectance may be 95% or more. The first reflective coating film 130 may be formed to a thickness of several micrometers to several millimeters.

The second substrate 200 may be symmetrically formed corresponding to the first substrate 100. Specifically, a second low reflective coating film 220 may be provided on a side of a second outer surface, which is the outer surface toward the outer direction of a second glass substrate 210 and a second reflective coating film 230 may be provided on a side of the inner surface of the second glass substrate 210.

The first substrate 100 and the second substrate 200 are coupled in a direction in which the first reflective coating film 130 and the second reflective coating film 230 are opposed to each other and are separated by a predetermined distance.

The spacer 400 may be provided on a side of the inner surface so that the first substrate 100 and the second substrate 200 can be maintained at regular intervals.

Meanwhile, the shape of the etalon may be formed in a rectangular shape when viewed from the front and may generally be manufactured with a size of 1 cm or less in both sides.

Figure 2:
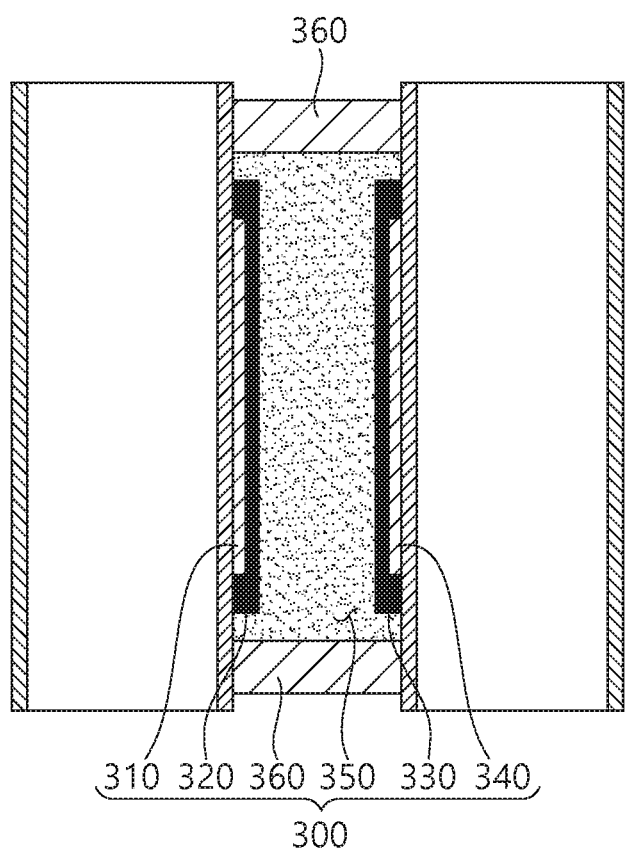
FIG. 2 shows a cross-sectional view of an etalon cell according to a first embodiment of the present invention.

FIG. 2 is a cross-sectional view of an etalon cell according to a first embodiment of the present invention. As shown, a liquid crystal unit 300 for driving a liquid crystal is added to the conventional etalon described above.

The liquid crystal part 300 may be formed to include a first transparent electrode 310, a second transparent electrode 340, a first alignment layer 320, a second alignment layer 330, a liquid crystal layer 350, and a sealing member 360.

The first transparent electrode 310 may be formed on a first reflective coating film 130. The first transparent electrode 310 may be provided to operate the liquid crystal layer 350 to be described later. The first and second transparent electrodes 310, 340 may be formed to include a connecting portion connected to an external circuit.

Since such an electrode is a feature widely used in the technical field related to LCD, etc., a further detailed description will be omitted herein.

The first alignment layer 320 is formed while covering the first transparent electrode 310 and is configured to facilitate the alignment at a certain angle when operating the liquid crystal layer 350. The first alignment layer 320 may be formed by a vacuum deposition method to have a uniform thickness and may be formed to include a specific pattern on an alignment surface, which is the direction toward the first inner surface. In particular, the specific pattern may be formed at a predetermined angle as needed.

The first alignment layer 320 may be formed while covering a transparent electrode and may be formed in the form of a thin film. The first alignment layer 320 may be formed in an area that is not in contact with the sealing member 360 to be described later in order to secure an adhesive force in an area where the sealing member 360 to be described later is contacted for sealing the liquid crystal layer.

The first alignment layer 320 may be formed to include an inorganic insulating film and may be the inorganic insulating film itself. The inorganic insulating film may contain materials such as $SiO_x$ or $SiN_x$.

The first alignment layer 320 may be formed to a thickness of 30 nm to 200 nm to maintain the function of an alignment layer itself while minimizing the influence of the alignment layer itself during light transmission.

Meanwhile, the second transparent electrode 340 and the second alignment layer 330 may be formed on a side of the second inner surface of the second substrate 200 by selecting the shape, thickness, and material in the same manner to correspond to the first transparent electrode 310 and the first alignment layer 320.

However, although not shown, the transparent electrode may be modified to be disposed between the reflective coating film and the substrate. That is a pair of reflective coating films 310, 330 and a pair of transparent electrodes 320, 340 disposed at intermediate of the first and second substrates 100, 200.

The liquid crystal layer 350 is filled at intermediate of the first substrate 100 and the second substrate 200 and is operated by a transparent electrode.

The sealing member 360 is provided to seal the liquid crystal layer 350 and is configured to maintain a parallel state of the substrates between the first substrate 100 and the second substrate 200. The sealing member 360 is formed along the periphery of the liquid crystal layer 350 and is configured to contact a side of the first inner surface of the first substrate 100 and a side of the second inner surface of the second substrate 200 to prevent the liquid crystal from being flowed out. In particular, one side of the sealing member 360 may be formed by contacting with the first reflective coating film 130 or the first glass substrate 110 and the other side may be formed by contacting with the second reflective coating film 230 or the second glass substrate 210.

Since the liquid crystal layer 350 and the sealing member 360 are features widely used in the LCD field, the detailed description with regard to their structures, materials, etc., are omitted herein.

As such, in this embodiment, the liquid crystal layer 350 is provided between both substrates of the etalon, and it is possible to selectively modify the wavelength of the light being transmitted by driving a liquid crystal by the first transparent electrode 310 and the second transparent electrode 340.

Hereinafter, the etalon cell according to the second embodiment of the present invention will be described with reference to FIG. 3. The second embodiment may include the same constituting elements as those of the first embodiment described above, and only differences in features will be described in order to avoid a redundant description.

Figure 3:
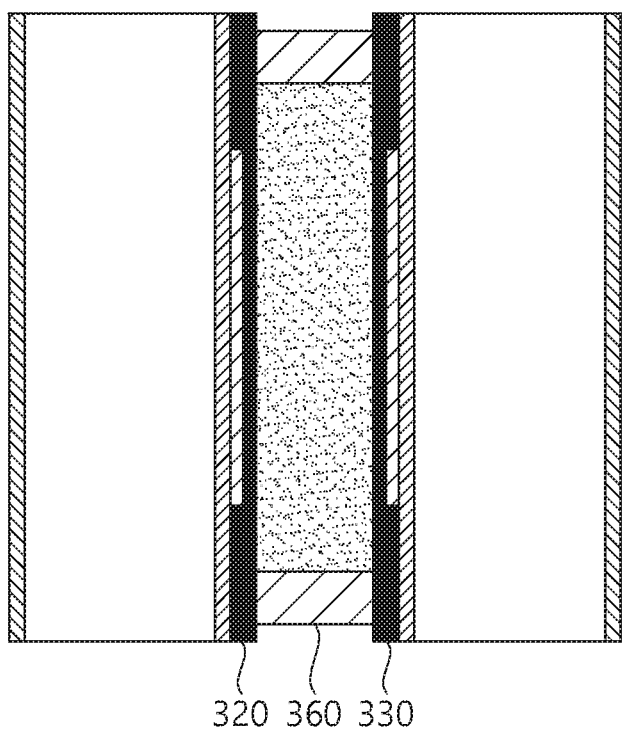
FIG. 3 shows a cross-sectional view of an etalon cell according to a second embodiment of the present invention.

FIG. 3 is a cross-sectional view of an etalon cell according to the second embodiment of the present invention. As shown, the first alignment layer 320 and the second alignment layer 330 are formed in an extended manner compared to those in the first embodiment, and it is shown that the sealing member 360 is in contact with the first alignment layer 320 and the second alignment layer 330.

In particular, the first alignment layer 320 and the second alignment layer 330 may be formed of an inorganic insulating film. Generally, the alignment layer used for an LCD, etc., can be selected from a polyimide-based material. However, since a polyimide tends to have a somewhat lower adhesive force than an inorganic insulating film, in a case where the alignment layer is provided by being in contact with the sealing member 360, it may be separated between the alignment layer and the substrate. Accordingly, the alignment layer may be selected to include an inorganic insulating film to prevent its separation. In particular, the first alignment layer 320 and the second alignment layer 330 are provided on sides of the first and second inner surfaces and the alignment layer may be formed on a portion where the sealing member 360 is formed. In such a configuration, the liquid crystal layer 350 may be in uniform contact with the alignment surface without a blank portion on the first and second inner surfaces.

Hereinafter, a method for manufacturing an etalon containing a liquid crystal layer 350, which is the third embodiment of the present invention, will be described in detail with reference to FIGS. 4 to 6.

FIG. 4 is a conceptual diagram illustrating a printing process of a culture membrane applied in the manufacture of LCD. As shown in the drawing, a technique of coating an alignment layer to an electrode portion by a printing method is shown, and the printing is performed using a roller. Generally, a polyimide-based organic film may be used for the alignment layer in the LCD field. As shown in the area A, the periphery of the end portion of the alignment layer is formed to be more thickened by the coffee ring effect during the solution drying process. Such a coffee ring effect may not be a problem in a relatively large LCD, but it may be an important issue to deteriorate quality in an etalon cell of several millimeters in size. In the etalon cell, the transparent electrode is as small as 1 mm, and if the thickness of the end portion of the alignment layer is not uniform, it may affect even the central area. Additionally, since an etalon is required to have the optical characteristics that the parallelism of the two mirror surfaces be uniform at several nanometers, this non-uniformity is an important reason for deteriorating the optical characteristics of an etalon.

Figure 5:
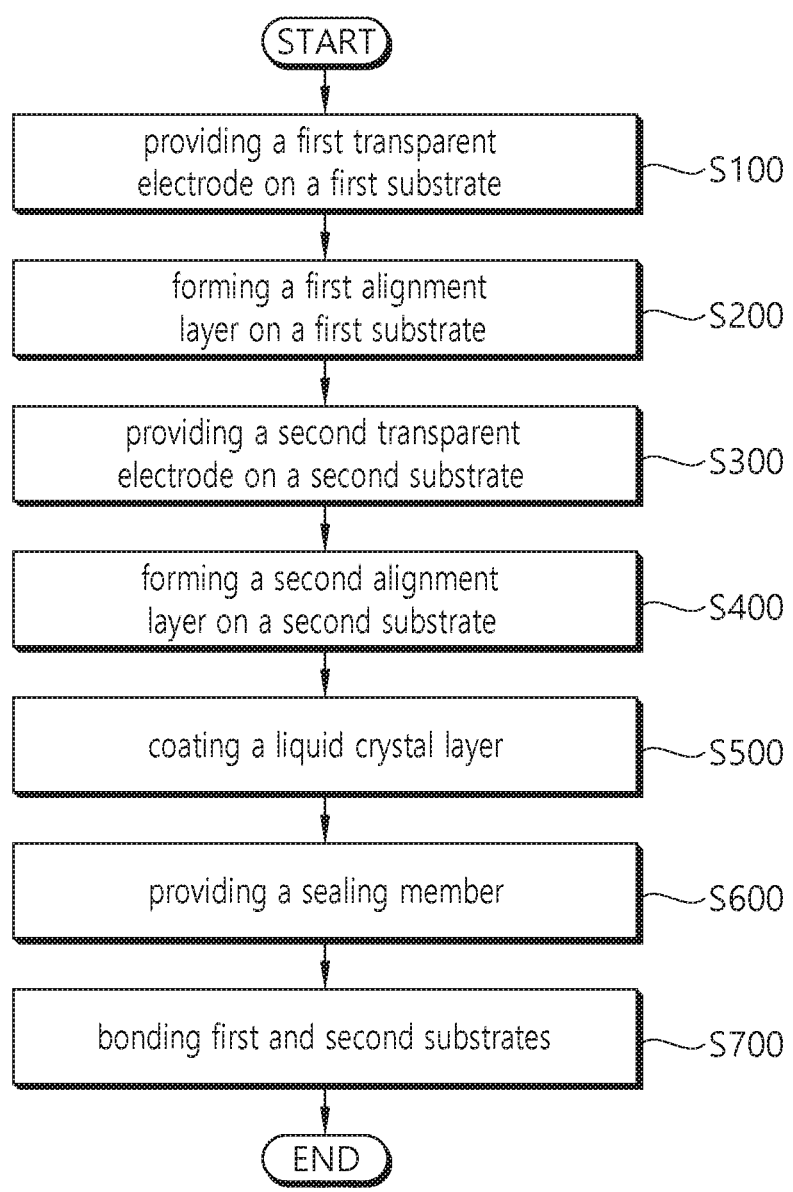
FIG. 5 shows a flowchart of a method for manufacturing an etalon cell according to a third embodiment of the present invention.
Figure 6:
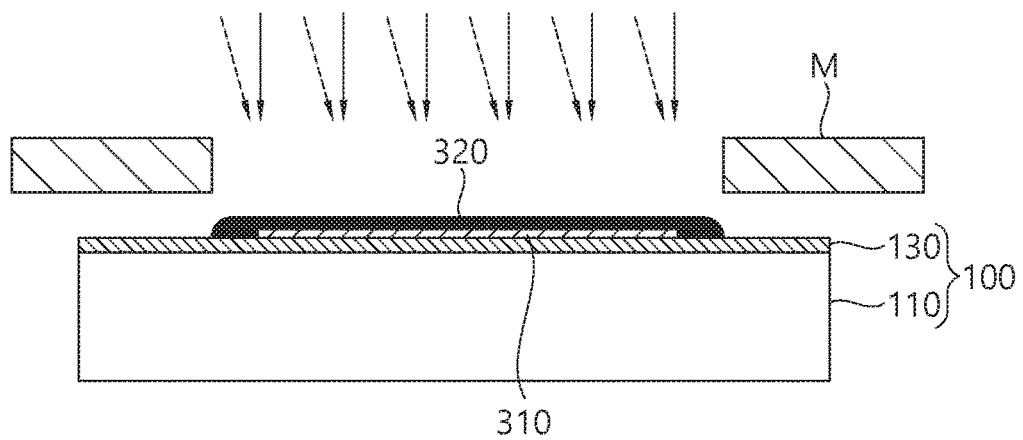
FIG. 6 shows a conceptual diagram illustrating the formation of an alignment layer in the third embodiment.

FIG. 5 shows a flowchart of a method for manufacturing an etalon cell, which is a third embodiment of the present invention and FIG. 6 shows a conceptual diagram illustrating the formation of an alignment layer in the third embodiment.

As shown, the method for manufacturing an etalon containing a liquid crystal layer 350 may include: forming a first transparent electrode 310 on a first substrate 100 (S100), forming a first alignment layer 320 on the first substrate 100 (S200), forming a second transparent electrode 340 on a second substrate 200 (S300), forming a second alignment layer 330 on the second substrate 200 (S400), forming a liquid crystal layer 350 (S500), coating a sealing member 360 (S600), and bonding a first substrate 100 and a second substrate 200 (S700).

Forming the first transparent electrode 310 on the first substrate 100 corresponds to forming the first transparent electrode 310 on a side of the first mother substrate 110. The first transparent electrode 310 may be formed only on a part of the area of the first mother substrate 110. The first transparent electrode 310 may be formed using a pattern by a photoetching process.

Forming the first alignment layer 320 on the first mother substrate 110 corresponds to forming an alignment layer to be in contact with the liquid crystal layer 350 to be described later. FIG. 6 shows a method for forming an alignment layer with an inorganic insulating film using a shadow mask (M). In particular, the shadow mask (M) uses a patterned mask so that the alignment layer can be selectively formed only in an area where it is needed. Forming the first alignment layer 320 may be performed using a chemical vapor deposition (CVD) method, a thermal deposition method, a physical vapor deposition (PVD) method, etc. In particular, the pattern formed on the shadow mask M may form an alignment layer in a predetermined area while passing through the mask, and the first alignment layer 320 may be formed excluding the area where the sealing member 360 is to be coated as in the first embodiment or the first alignment layer 320 may be formed to include the area where the sealing member 360 is to be coated as in the second embodiment. Additionally, an area to be coated may be selected excluding the connecting portion for the connection between the first transparent electrode 310 and an external operation circuit.

Referring again to FIG. 6, when the alignment layer is deposited, it may be deposited vertically from the deposition surface (solid line arrow) or may be deposited at a predetermined angle (chain line arrow). When the alignment layer is deposited at an oblique angle, the liquid crystal may be aligned in a certain direction without a rubbing process.

Forming the second transparent electrode 340 on the second substrate 200 (S300) may include forming the second transparent electrode 340 using a pattern by a photoetching process, which corresponds to forming the first transparent electrode on the first substrate 100.

Forming the second alignment layer on the second substrate 200 (S400) corresponds to forming the first alignment film and may be performed in the same manner.

Coating the liquid crystal layer 350 (S500) corresponds to coating a liquid crystal on the first substrate 100 or the second substrate 200.

Coating the sealing member 360 (S600) may include coating the sealing member 360 in an area encompassing the liquid crystal layer 350 to prevent leakage of the liquid crystal onto the first substrate 100 or the second substrate 200. The sealing member 360 may be uniformly coated along the periphery of the liquid crystal layer 350 to serve as a spacer 400 for maintaining a uniform distance between the substrates after bonding the substrates (S700) to be described later.

Bonding the first substrate 100 and the second substrate 200 (S700) corresponds to sealing the liquid crystal layer 350 while attaching the sealing member 360 to both substrates with the two substrates kept in parallel. In particular, although not shown, curing the sealing member 360 (not shown) may be performed after aligning and maintaining the distance between both substrates (not shown).

Figure 7:
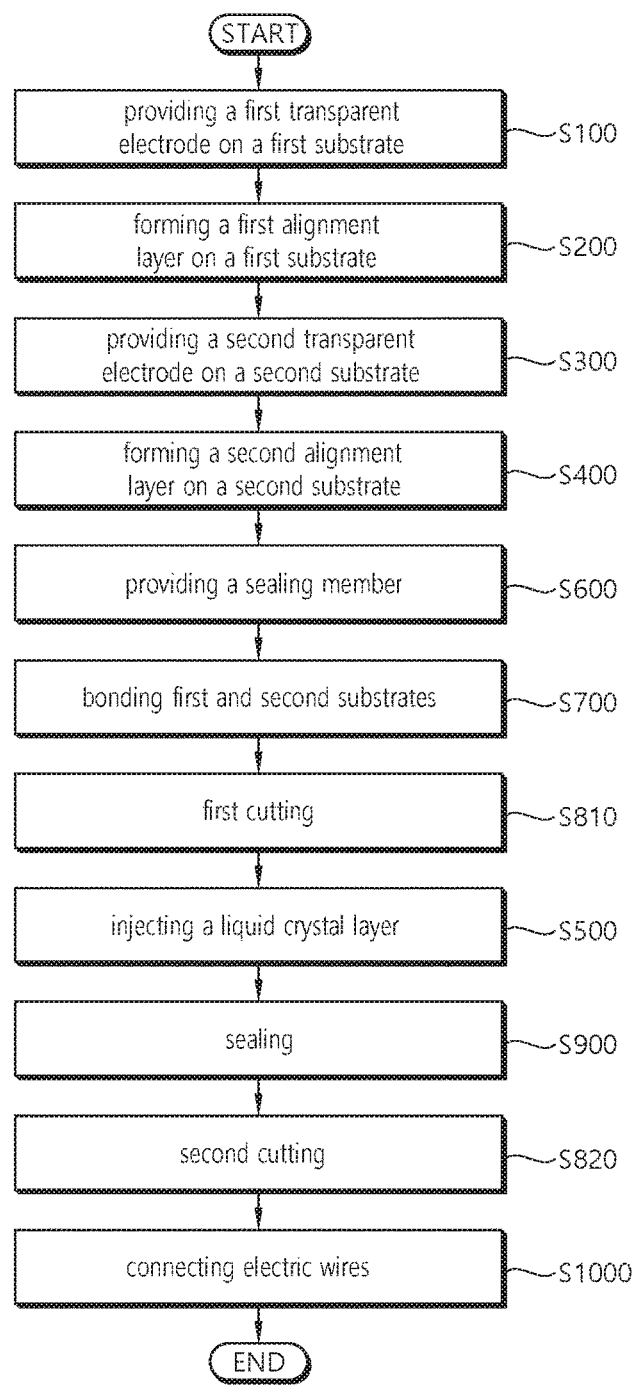
FIG. 7 shows a flowchart illustrating a method for manufacturing an etalon according to a fourth embodiment of the present invention.
Figure 8:
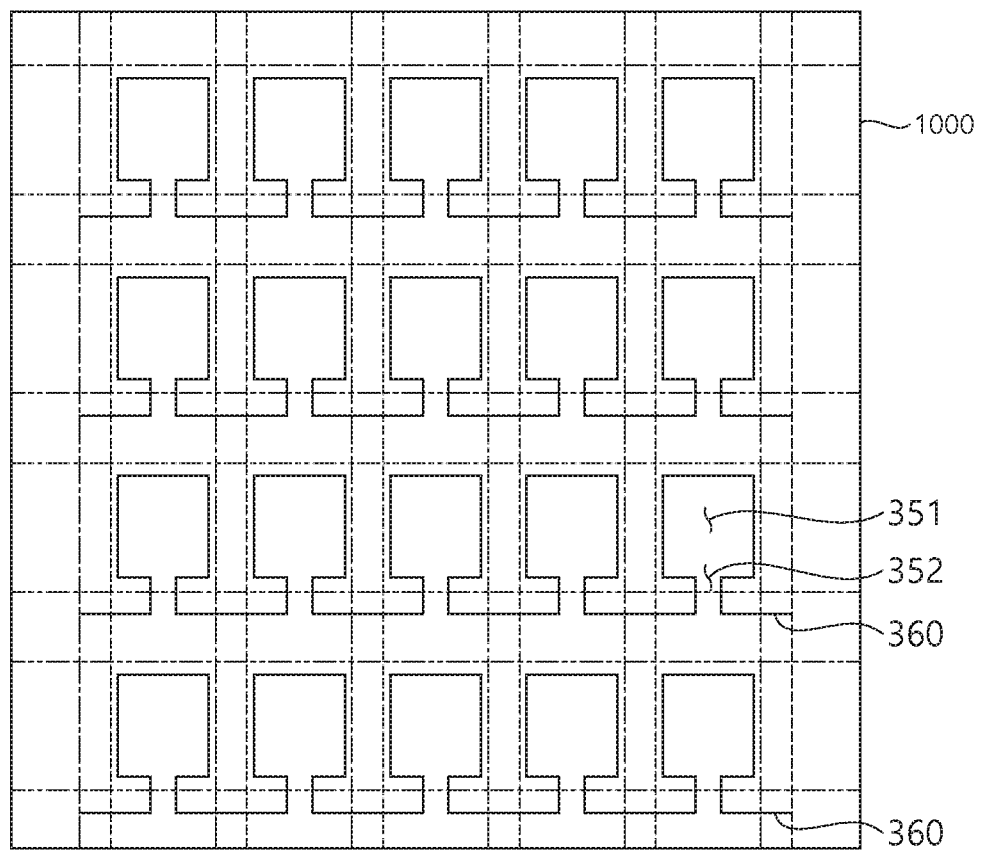
FIG. 8 shows a view showing a pattern of a sealing member and a cutting line.
Figure 9A:
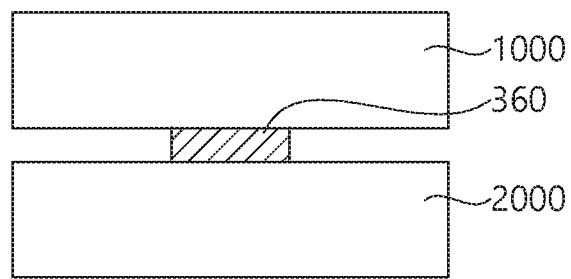
FIGS. 9A, 9B, 9C and 9D shows views illustrating a sealing member and a portion where the cutting line is etched.
Figure 9B:
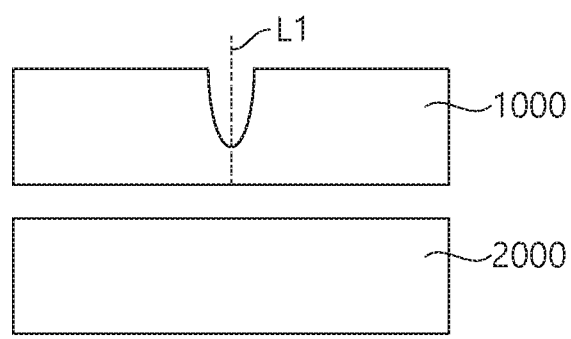
Figure 9C:
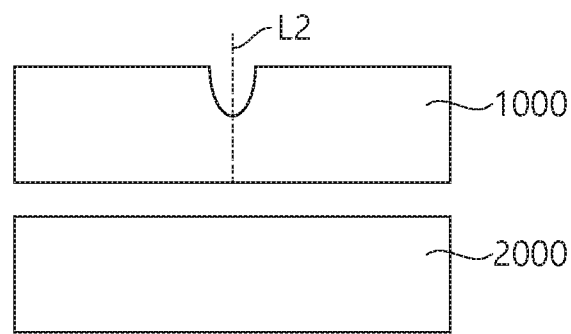
Figure 9D:
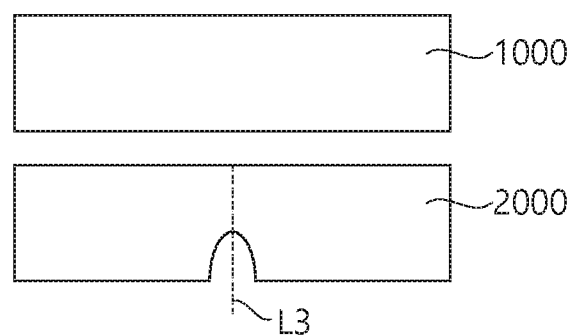

FIG. 7 shows a flowchart illustrating a method for manufacturing an etalon according to a fourth embodiment of the present invention; FIG. 8 shows a view showing a pattern of a sealing member and a cutting line; FIG. 9 shows views cross-sectional views of a sealing member and a portion where the cutting line is etched; and FIG. 10 shows a top view and a cross-sectional view of an etalon manufactured according to the fourth embodiment.

As shown in the drawings, in the fourth embodiment of the present invention, unlike the third embodiment, a liquid crystal layer is injected into a space for receiving a liquid crystal layer 351 and it is manufactured to be divided into multiple cells so as to produce multiple etalons in mother substrate 1000, 2000.

In this embodiment, forming a first transparent electrode on a first mother substrate 1000 (S100), forming a first alignment layer on the first mother substrate (S200), forming a second transparent electrode on the second mother substrate 2000 (S300), forming the second alignment layer on the second mother substrate (S400), coating a sealing member (S600), bonding substrates (S700), a first cutting (S810), forming a liquid crystal layer (S500), sealing (S900), a second cutting (S820), and connecting electric wires (S1000) may be included.

In this embodiment, unlike the third embodiment, providing the first transparent electrode on the first mother substrate (S100), forming the first alignment layer on the first mother substrate (S200), providing the second transparent electrode on the second mother substrate (S300), and forming the second alignment layer on the second mother substrate (S400) are performed in multiple sites in each substrate in a cell unit. Additionally, the first and second mother substrates are mother substrates on which multiple etalons may be formed, and they may be relatively larger than etalon and may be formed to have the same size. However, the structure of a single etalon comprising a substrate, a transparent electrode, and an alignment layer may be formed in the same manner as in the third embodiment.

Coating a sealing member (S600) is a step of coating a sealing member in a repetitive pattern so as to produce multiple etalons in a large scale. The pattern of the sealing member is coated in such a pattern that liquid crystal can be injected simultaneously when multiple etalons are simultaneously manufactured. In particular, a drawing work is performed using a dispenser device in a pattern having a liquid crystal layer injection hole 352 in the same direction. In particular, the liquid crystal layer injection hole 352 is formed to be disposed between the respective cells to be exposed to the outside by the first cutting (S810) to be described later. The specific pattern is as shown in FIG. 8. As shown in the drawing, multiple cells arranged in the horizontal direction are connected to one solid line. Meanwhile, a sealing member is preferred to be drawn not to come in contact with the alignment layer formed on the substrate, but it may be formed on the alignment layer as needed.

As shown in FIG. 8, the sealing member is formed in such a pattern that divides it into an n×m number of cells so that an etalon can be manufactured in an n×m array on one mother substrate. In particular, one row may be formed with a liquid crystal layer injection hole 352 in the same direction so that the liquid crystal can be injected simultaneously or sequentially. A sealing member is coated to three directions excluding the liquid crystal layer injection hole 352 through a closed pathway to prevent the leakage of a liquid crystal.

Bonding the substrates (S700) is a step of bonding the first and second substrates.

First cutting (S810) is a step which corresponds to a primary cutting for injecting liquid crystal into multiple cavity for receiving the liquid crystal layer 351 arranged in a row, e.g., a part of multiple cells arranged, e.g., one row. In FIG. 8, the cutting is performed along the first cutting line L1, and the injection hole 352 formed in the downward direction is exposed to the outside in each row.

Forming the liquid crystal layer (S500) is a step for injecting a liquid crystal into each of a cavity for receiving a liquid crystal layer 351, and liquid crystal is injected through the liquid crystal layer injection hole 352. In particular, the liquid crystal may be injected within the vacuum condition. However, this is merely an embodiment and may be applied in various ways of injecting a liquid crystal such as an ink jet.

Sealing (S900) corresponds to a step of sealing the space for receiving a liquid crystal layer 351 by sealing the liquid crystal layer injection hole 352 after injecting a liquid crystal Second cutting (S820) corresponds to the step of separating each cell individually. In FIG. 8, each of the cells may be separated from each other by cutting along a second cutting line (L2) and a third cutting line (L3). In particular, the second cutting line (L2), where the first substrate is cut, and a third cutting line (L3), where the second substrate is cut, may be formed at positions spaced horizontally apart from each other. This will be described in detail referring to FIG. 9.

Connecting electric wires (S1000) corresponds to the step of connecting electric wire 500 to a transparent electrode formed in each etalon. In particular, various methods of electrical connection such as soldering may be applied.

Referring again to FIG. 9, etching may be performed first using a laser cutter to cut each of the mother substrates 1000, 2000 before performing the first cutting (S810) and the second cutting (S820). In particular, the laser etching is performed in a direction opposite to the vertical direction in a state where the substrates are bonded to each other. With regard to the etching depth, it is preferred to etch more than half of the thickness of each substrate so that the cutting can be easily performed. Then, the mother substrates 1000, 2000 are subjected to a physical impact and cut along the first cutting line (L1).

In the second cutting (S820), the first and second substrates may be formed in such a manner that the horizontal distance between the second cutting line (L2) and the third cutting line (L3) are separated more than a predetermined distance while being in a state bonded to each other so that the first and second substrates have the same area but with some mismatch to some extent. The predetermined distance is configured so that the transparent electrodes formed on each substrate and the electrode pad connected to the electrode can be provided, and the first and second substrates facing each other may be configured to be rotationally symmetrical with each other by 180 degrees. In such a case, the substrates can be efficiently used without being discarded.

Meanwhile, the second cutting line (L2) and the third cutting line (L3) are etched using a laser cutter on each of the opposing surfaces of the first and second substrates, and they are preferably etched to about a half of the etching depth of the first cutting line (L1) described above. Although it was explained that the first cutting step (S810) and the second cutting step (S820) are performed at different time-points, the etching preceding the cutting (S810, S820) may be performed simultaneously.

Figure 10A:
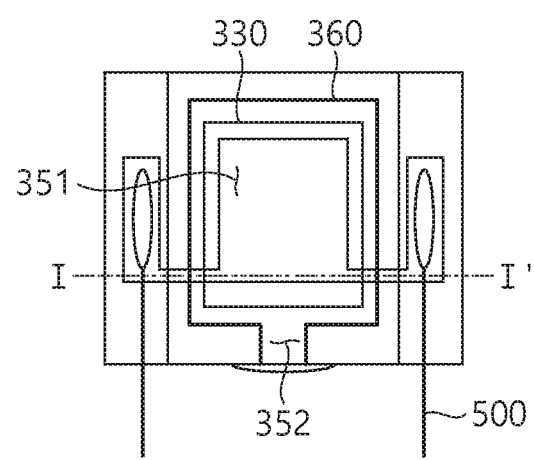
FIG. 10A shows a top view of an etalon manufactured according to the fourth embodiment.
Figure 10B:
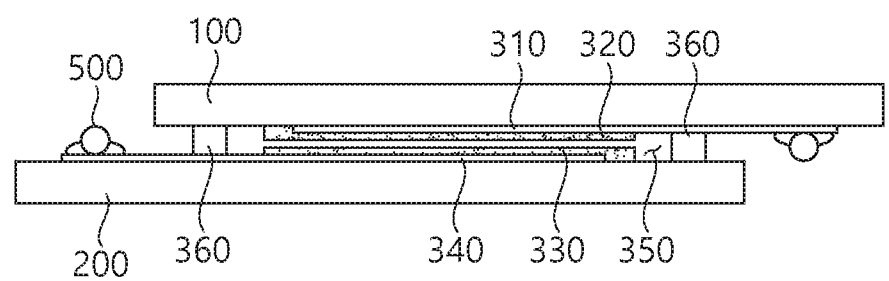
FIG. 10B shows a cross-sectional view of an etalon manufactured according to the fourth embodiment.

FIG. 10A and FIG. 10B shows an etalon manufactured according to the fourth embodiment. As shown in the drawing, the electric wire 500 is connected to both sides in a horizontal direction in a cavity for receiving a liquid crystal layer 351, and a side of the cavity for receiving a liquid crystal layer 351 is sealed with the sealing member 360, and the upper and lower sides of the sealing member are sealed with the first substrate 100 and the second substrate 200. In particular, the liquid crystal layer 350 is horizontally in contact with the alignment layers (320, 330).

Figure 11:
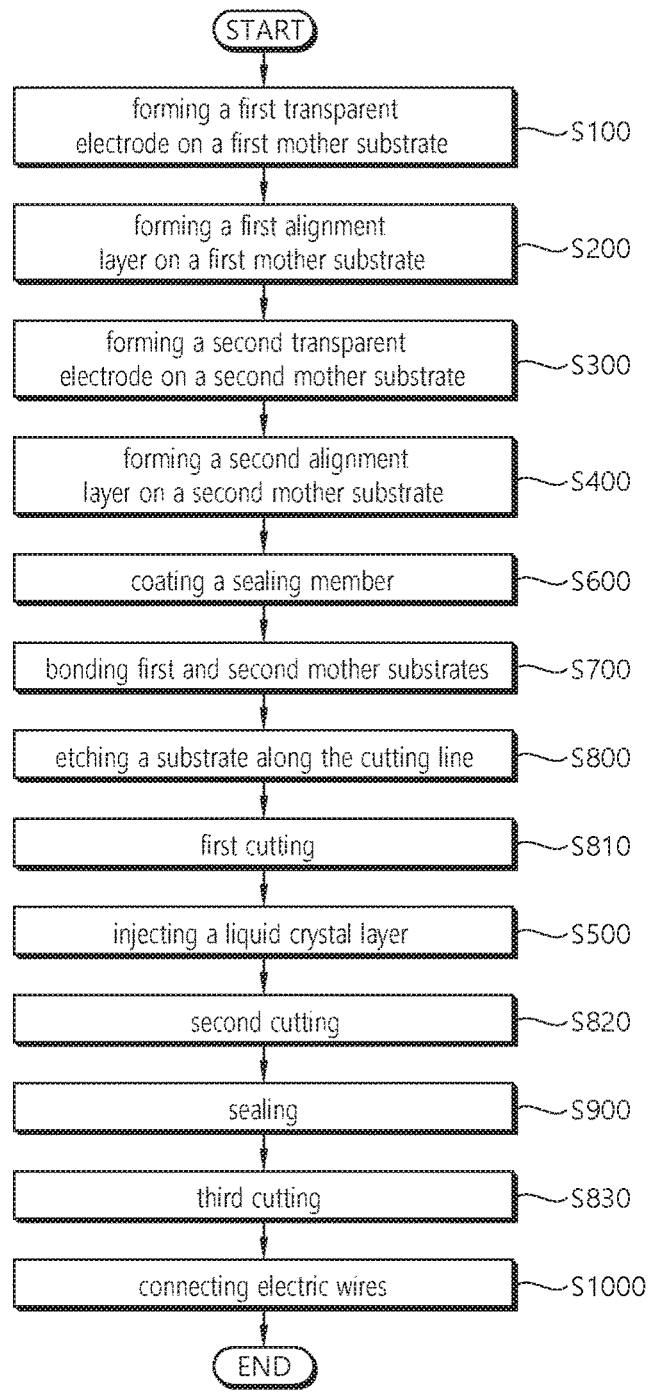
FIG. 11 shows a flowchart of a fifth embodiment.
Figure 12:
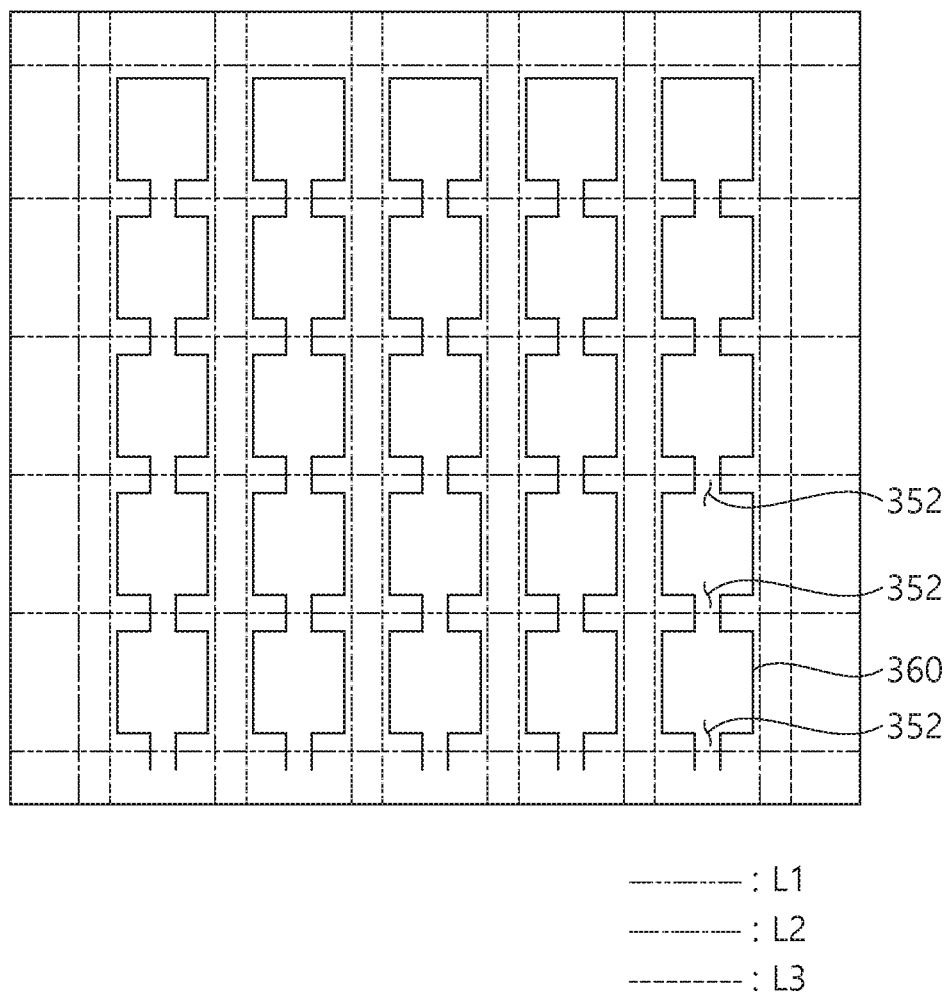
FIG. 12 shows a view illustrating a sealing member coating pattern of the fifth embodiment.

FIG. 11 shows a flowchart of the fifth embodiment and FIG. 12 shows a view illustrating a sealing member coating pattern of the fifth embodiment.

As shown, the pattern of the sealing member of the present invention is different from that of the third embodiment and the cutting step consists of 3 steps, and the sequence of sealing is applied differently.

Coating a sealing member (S600) consists of solid lines connected in the vertical direction in the drawing among multiple cells. In particular, the injection hole 352 is formed in the vertical direction in the cells excluding the uppermost ones.

Then, bonding substrates (S700) is performed.

Etching (S800) corresponds to a step of etching substrates along the first cutting line (L1), the second cutting line (L2), and the third cutting line (L3) on the bonded substrates.

The first cutting line (L1) is formed horizontally in the drawing so that each of the cells can be distinguished vertically. In particular, the first and second substrates are etched on the same line and laser etching is performed along the direction of the substrates facing each other. In particular, the etching depth is preferred to be equal to or more than half of the thickness of the substrates as in the first cutting (S810) described above.

The second cutting line (L2) and the third cutting line (L3) are formed in the vertical direction in the drawing, so that each of the cells can be distinguished on the left and right, and the second cutting line (L2) and the third cutting line (L3) are respectively formed on different substrates, with the horizontal distance separated at a predetermined distance.

The first cutting (S810) corresponds to a step of cutting the substrates along the first cutting line L1 at the lowermost side. Accordingly, in the multiple cells arranged in the vertical direction, the injection hole 352, which is in fluid communication in the vertical direction along the direction in which the solid line is formed, is exposed.

Forming a liquid crystal layer (S500) corresponds to a step of simultaneously filling a liquid crystal layer into the space for receiving a liquid crystal layer 351 formed in multiple vertical columns. In this case, the liquid crystal layer can be formed in all the cells arranged in one column by a single filling.

The second cutting (S820) corresponds to a step of cutting the substrates in the horizontal direction along the remaining first cutting line (L1). Accordingly, two or one injection hole 352 formed in the vertical direction (the cell arranged at the uppermost side) is exposed in each of the cells.

Sealing (S900) corresponds to a step of sealing two or one injection hole 352.

The third cutting (S830) corresponds to a step of cutting the substrates along the second cutting line (L2) and the third cutting line (L3) so that multiple cells arranged in the horizontal direction can be separated individually.

Then, the electric wire connecting (S1000) is the same as in the embodiments described above. As described above, the etalon containing the liquid crystal layer 350 and a method for manufacturing the same may modulate the selected wavelength by including the liquid crystal unit 300, and an etalon capable of securing an adhesion force between an alignment layer and a substrate can be manufactured by constituting the alignment layer with an inorganic insulating film.

ADVANTAGEOUS EFFECTS OF THE INVENTION

The etalon and the method of manufacturing the same according to the present invention have an effect of electrically changing the selected wavelength by actively changing the refractive index according to the applied voltage because a liquid crystal layer is provided between the first and second substrates, and also have an effect of providing a method for manufacturing such etalon.

What is claimed is:

1. A wavelength-tunable type etalon comprising a liquid crystal layer, comprising:
   a first substrate;
   a second substrate arranged in parallel with the first substrate;
   a pair of reflective coating films each provided on a respective facing surface of the first substrate and the second substrate;
   a sealing member provided between the pair of reflective coating films to define a cavity;
   a pair of transparent electrodes each provided on a respective facing surface of the pair of the reflective coating films in the cavity;
   a pair of alignment layers each covering the respective transparent electrode in the cavity; and
   the liquid crystal layer disposed in the cavity,
   wherein the sealing member is configured to directly contact with the respective facing surface of the pair of the reflective coating films.

2. The wavelength-tunable type etalon of claim 1, wherein the first and second substrates comprise glass, quartz, and/or silicon wafer so as to be substantially transparent in a band of 1300 nm to 1700 nm.

3. The wavelength-tunable type etalon of claim 2, wherein the pair of alignment layers each comprise an inorganic insulating film.

4. The wavelength-tunable type etalon of claim 3, wherein the inorganic insulating film comprises $SiO_x$ or $SiN_x$.

5. The wavelength-tunable type etalon of claim 3, wherein the inorganic insulating film has a thickness in the range of 30 nm to 200 nm.

6. The wavelength-tunable type etalon of claim 3, wherein the inorganic insulating film is formed by vacuum deposition.

7. The wavelength-tunable type etalon of claim 6, wherein the inorganic insulating film is disposed on a part of the respective facing surface of the respective reflective coating film and covers the respective transparent electrode.

8. A method for preparing a wavelength-tunable type etalon comprising a liquid crystal layer, the method comprising:
   providing a first transparent electrode on a part of a first reflective coating film on a first substrate;
   forming a first alignment layer covering the first transparent electrode;
   providing a second transparent electrode on a part of a second reflective coating film on a second substrate;
   forming a second alignment layer covering the second transparent electrode;
   forming the liquid crystal layer over the respective reflective coating film;
   providing a sealing member on a respective facing surface of the first reflective coating film and the second reflective coating film along a periphery of the liquid crystal layer; and
   bonding the first substrate and the second substrate,
   wherein the sealing member is configured to directly contact with the respective facing surface of the first reflective coating film and the second reflective coating film.

9. The method of claim 8, wherein the first substrate and the second substrate comprise glass, quartz, and/or silicon wafer so as to be substantially transparent in a band of 1300 nm to 1700 nm.

10. The method of claim 9, wherein the first and second alignment layers are inorganic insulating films.

11. The method of claim 10, wherein the forming the first alignment layer and the forming the second alignment layer are by vacuum deposition.

12. The method of claim 10, wherein the inorganic insulating films comprise $SiO_x$ or $SiN_x$.

13. The method of claim 10, wherein the first alignment layer and the second alignment layer each have a thickness in the range of 30 nm to 200 nm.

14. The method of claim 8, wherein the forming the first alignment layer and the forming the second alignment layer includes forming an inorganic insulating film on parts of the first substrate and the second substrate to prevent deposition in an area of a connecting portion, where the first transparent electrode or the second transparent electrode is connected to an external circuit, and an area where the sealing member is coated.

15. The method of claim 10, wherein the sealing member is in contact with the first alignment layer.

16. A method for preparing a wavelength-tunable type etalon comprising a liquid crystal layer, the method comprising:
   providing a first transparent electrode on a part of a first reflective coating film on a first substrate;
   forming a first alignment layer covering the first transparent electrode;
   providing a second transparent electrode on a part of a second reflective coating film on a second substrate;
   forming a second alignment layer covering the second transparent electrode;
   providing a sealing member on the respective reflective coating film along a periphery of the respective transparent electrode;
   bonding the first substrate and the second substrate;
   injecting a liquid crystal into a cavity defined by the reflective coating films and the sealing member; and
   sealing the cavity,
   wherein the sealing member is configured to directly contact with a respective facing surface of the first reflective coating film and the second reflective coating film.

17. The method of claim 16, wherein the first substrate is a first mother substrate, the second substrate is a second mother substrate;
   the first alignment layer, the first transparent electrode, the second alignment layer, the second transparent electrode, and the sealing member are formed in a repeated pattern on multiple cells; and
   wherein the multiple cells are separated by cutting the first mother substrate and the second mother substrate.

18. The method of claim 17, wherein the cutting further comprising:
   a first cutting, by which injection holes of the multiple cells are exposed after the bonding; and
   a second cutting, by which each of the multiple cells is independently separated after the sealing of the cavity for the liquid crystal layer.

* * * * *